(12) United States Patent
Sipiläet al.

(10) Patent No.: US 6,933,503 B2
(45) Date of Patent: Aug. 23, 2005

(54) IMAGING X-RAY DETECTOR BASED ON DIRECT CONVERSION

(75) Inventors: Heikki Johannes Sipilä, Espoo (FI); Jacques Bourgoin, Avon (FR)

(73) Assignee: Oxford Instruments Analytical Oy, Espoo (FI)

(*) Notice: Subject to any disclaimer, the term of this patent is extended or adjusted under 35 U.S.C. 154(b) by 224 days.

(21) Appl. No.: 10/458,910

(22) Filed: Jun. 11, 2003

(65) Prior Publication Data

US 2004/0007671 A1 Jan. 15, 2004

(30) Foreign Application Priority Data

Jun. 27, 2002 (FI) ............................................. 20021255

(51) Int. Cl.⁷ ................................................ G01T 1/24
(52) U.S. Cl. ............................ 250/370.09; 250/370.11
(58) Field of Search ...................... 250/370.09, 370.11, 250/370.14, 367, 363.02, 385.11; 257/290, 200, 201, 12, 627

(56) References Cited

U.S. PATENT DOCUMENTS

| | | | |
|---|---|---|---|
| 5,001,536 A | * | 3/1991 | Fukuzawa et al. .......... 257/192 |
| 5,512,756 A | | 4/1996 | Bayer et al. |
| 5,596,200 A | * | 1/1997 | Sharma et al. ......... 250/370.14 |
| 5,981,986 A | * | 11/1999 | Tsuchiya ..................... 257/200 |
| 6,248,990 B1 | | 6/2001 | Pyyhtiä et al. |
| 6,403,965 B1 | * | 6/2002 | Ikeda et al. ............ 250/370.09 |
| 2005/0040445 A1 | * | 2/2005 | Mouli ........................ 257/290 |

* cited by examiner

Primary Examiner—Otilia Gabor
(74) Attorney, Agent, or Firm—Wood, Phillips, Katz, Clark & Mortimer

(57) ABSTRACT

An X-ray detector (401, 501, 601) has a detecting element that comprises a semiconductor heterostructure where an undoped Germanium layer (402, 502) is enclosed between two oppositely doped Gallium Arsenide layers (403, 404, 503, 505).

19 Claims, 5 Drawing Sheets

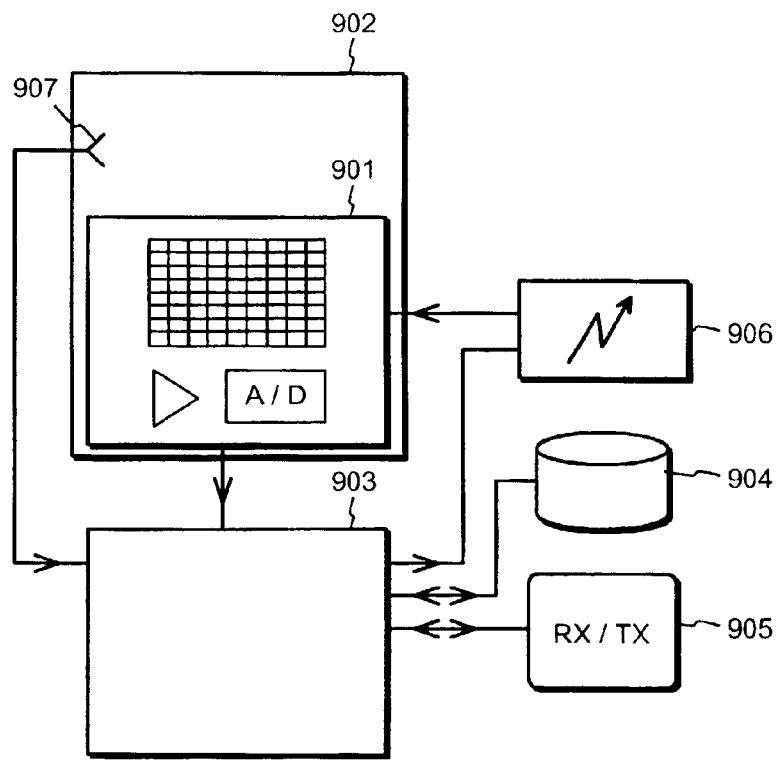
Fig. 9
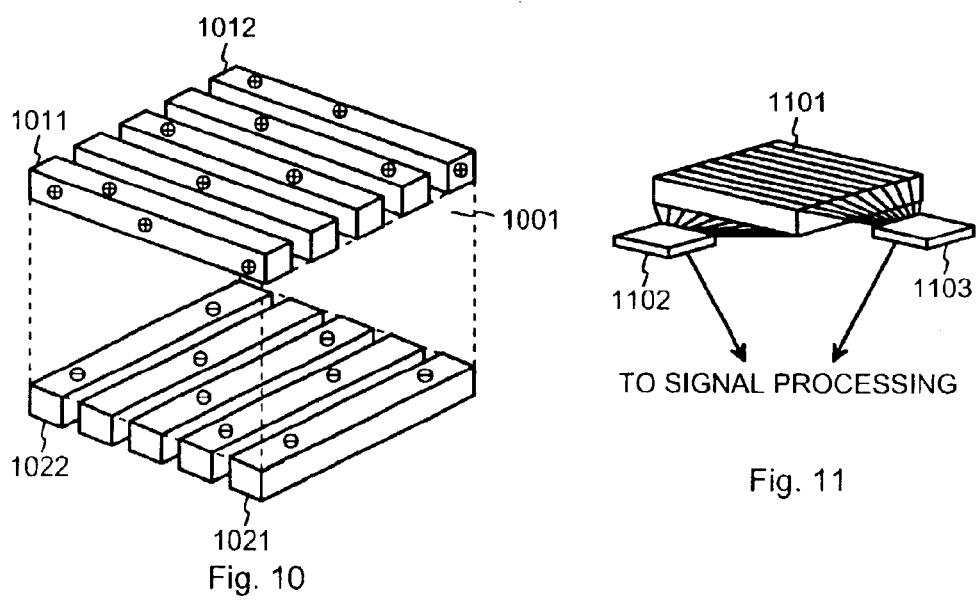
Fig. 10
Fig. 11

IMAGING X-RAY DETECTOR BASED ON DIRECT CONVERSION

TECHNICAL FIELD

The invention concerns generally the technology of producing digital images of objects illuminated with X-rays. Especially the invention concerns the composition, structure and manufacturing method of a detector that is used for producing a digital image of the illuminated object.

BACKGROUND OF THE INVENTION

FIG. 1 illustrates schematically a conventional way of producing an X-ray image in electronic form. An X-ray tube 101 emits X-rays that propagate through an object under study (such as a part of a human body) 102 and enter an image intensifier 103. Optical equipment 104 convey the output signal of the image intensifier 103 onto a CCD array 105, from which the two-dimensional image is read and stored into a memory 106 and/or shown on a display 107. The drawbacks of the conventional approach arise from the large number of different devices and components that take part in converting the spatial distribution of differently attenuated x-rays into an actual image. Taking the signal through a variety of devices and components reduces the efficiency of collecting information from the object under study and introduces noise.

FIG. 2 illustrates a more recently adopted approach where detected X-rays are converted into an image through fewer intermediate phases. The whole arrangement of image intensifier, optics and CCD is now replaced with a single digital detector 201 the output signal of which is ready to be taken into a memory 106 and/or a display 107. The structure and operation of the digital detector 201 are thus such that the spatial distribution of X-ray intensity that hits the detector 201 can be more or less directly converted into an array of digital pixel values. Truly digital imaging of this kind can make the process of producing X-ray images in electronic form remarkably simpler and more efficient compared to the conventional approach of FIG. 1.

There remains the question of how should the digital detector 201 be constructed. At the priority date of this description the most well-known example of digital X-ray imaging detectors is the CsI/Si (Cesium Iodide/Silicon) detector of GE Medical Systems Corporation. FIG. 3 is a simplified cross-section of a CsI/Si detector panel 301. A CsI scintillator layer 302 is arranged to meet the incoming X-ray photons. Absorption of a photon into the CsI layer 302 causes light to be emitted locally into an amorphous Si panel 303 that is located immediately next to the CsI layer 302 and constitutes a two-dimensional photodiode/transistor array. It absorbs the light and converts it into electronic charge. Each photodiode in the amorphous Si panel 303 represents a pixel in the image to be generated. An arrangement of low-noise readout electronics 304 behind the amorphous Si panel 303 is employed to collect the accumulated charge from each photodiode and convert the individual quantities of collected charge into corresponding digital value. The two-dimensional constellation of digital values represents an image that can be stored into memory and/or shown on a display.

A critical factor of a detector of the type shown in FIG. 3 is the scattering of light between the CsI scintillator layer 302 and the amorphous Si panel 303. The objective of producing sharp images calls for keeping each burst of scintillation photons confined into an as small spatial sector as possible. GE Medical Systems Corporation announces having developed a "needle-like" structure for the CsI layer that should prevent scattering to a large extent. However, producing such a structure with good yield and highly homogenous gain throughout the detecting surface may be problematic. Homogeneity of the detector response is of crucial importance for example in medical imaging applications where far-reaching decisions are made on the basis of what fundamentally is a detected spatial distribution of received X-ray intensity. Another disadvantage of the structure of FIG. 3 are that only approximately one half of the visible light photons can be collected. Amorphous Si is not known to be a very good photodetector; it is used in this structure mainly because it allows building a detector with a relatively large area. Siemens Corporation has a corresponding product on the market with the trade name TRIXELL.

Other known techniques for obtaining digital X-ray images include slot scanning, where a linear detector is mechanically moved across the illumination beam; using tiled CCD arrays coupled to a scintillator plate via fiber optics; computed radiography where electrons are trapped on photostimulated plates that are then exposed to generate image data; and direct conversion. The last-mentioned has traditionally meant that two-dimensional Selenium detector panels are used for receiving the X-ray photons, which get absorbed and give rise to local accumulation of charges in the bulk of the Se substrate. Readout electronics are then employed to collect the accumulated charge and to convert the collected charge values into a two-dimensional image. The drawbacks of the Se-based direct conversion detector arrangements have been associated with questionable reliability as well as a relatively low DQE (Detective Quantum Efficiency) values, which cause degradation to image quality and preclude the use of Se-based direct conversion detectors in advanced applications of X-ray diagnostics and therapy.

SUMMARY OF THE INVENTION

It is an objective of the present invention to present an X-ray detector that is suitable for direct digital imaging, has a high efficiency in terms of utilizing the information carried by X-ray photons incident on the detector, and is suitable for mass production in respect of production yield, manufacturing cost and reliability in use. Further objectives of the invention are that the X-ray detector should have good absorption properties for X-rays and potential for good energy resolution, as well as small leakage current through the detector.

The objectives of the invention are met by using a high-purity Germanium layer as a central part of the detector and doped Gallium Arsenide layers on each side of said Germanium layer.

An X-ray detector according to the invention is characterized by the features that are recited in the characterizing part of the appended independent patent claim directed to an X-ray detector.

The invention also applies to an X-ray imaging arrangement that is characterized by the features that are recited in the characterizing part of the appended independent patent claim directed to an X-ray imaging arrangement.

Additionally the invention applies to a method for producing an X-ray detector. The method is characterized by the features that are recited in the characterizing part of the appended independent patent claim directed to a method.

Direct conversion detectors invariably involve the conversion of the energy of an incoming photon into a certain spatial distribution of electrical charge. Controlling and detecting the space charge region with reasonable accuracy requires the use of a high-quality semiconductor material, the properties of which are homogenous enough so that detection probability and accuracy is independent of the location at which the photon happened to hit the detector.

Germanium (or Ge for short) has been widely regarded as an unsuitable material for direct conversion detector applications at least in room temperature, because the excitation energy of electrons in Ge is small, only 0.65 eV, and consequently the leakage current through the material is prohibitively high. Otherwise Ge would have many advantageous properties. It is relatively straighforward to produce Ge wafers of extremely high purity and of desired thickness. The absorption cross-section of Ge is large enough for X-ray photons of the energy range used in typical imaging applications. For example absorption in Si is far too low, and consequently Si can be used for detecting only very low energy radiation. Ge is readily available at reasonable cost and it can advantageously provide very good energy resolution. For example Cadmium Telluride (CdTe) is very costly and suitable only for detectors with very small dimensions, with little or no potential for the application of microelectronic technology thereon.

According to the present invention, a high-purity Ge layer is complemented with doped Gallium Arsenide (GaAs) layers on each side. A negatively doped GaAs layer is located on one side of the Ge layer and a positively doped GaAs layer comes on the other side of the Ge layer. The resulting structure resembles a GaAs diode in electric operation, which means for example a relatively low leakage current even in room temperature. One of the GaAs layers is patterned in a suitable way to give rise to pixels. The Ge layer acts as a photoelectric absorber of the X-ray photons: each X-ray photon that gets absorbed in the Ge gives rise to a local cloud of electric charge, which is collected into the pixels and read with suitable integrated readout electronics. The circuit that takes care of the reading of charge from the pixels can be bonded onto one surface of the detector, or it may even be processed directly onto one of the doped GaAs layers.

The Ge layer is typically very thick compared to the GaAs layers: the thickness of the Ge layer is usually in the range between 0.2 and 2 mm, whereas the thickness of the GaAs layers is only in micrometer range, like between 1 and 5 micrometers, although the exact thickness value of the GaAs layers is not that important. The Ge layer should be thick enough to absorb a large majority of incident X-ray photons. On the other hand it is not advantageous to make the Ge layer any thicker than what is required for good absorption, because the thicker the Ge layer is, the larger is the minimum reasonable pixel size and the more vulnerable the structure is to interfering effects caused by impurities in the Ge material. In general the resistivity of the pure Ge material is high, and effects caused by residual impurities are negligible.

The low excitation energy of Ge gives rise to large statistical fluctuations in the number of free charge carriers in room temperature. This in turn means that a detector according to the invention is hardly suitable for spectroscopic analysis of the incoming X-rays unless the detector is heavily cooled. The resulting lack of information about quantum energies has no significance in most medical imaging applications, where essentially monochromatic X-rays are used for illumination anyway and all useful information resides in the spatial intensity distribution of X-rays that have propagated through the object under study. Additionally it is relatively straightforward to built a cooling arrangement to cool down the detector into a temperature range where thermal excitation starts to loose significance, in which case the detector according to the invention can also be used in spectroscopical applications.

The advantageousness of combining just GaAs with Ge comes from the near sameness of certain lattice constants of the two materials. Close lattice constants mean that producing a nice and regularly grown epitaxial layer of one material on top of the other in the manufacturing process is easy. Additionally recombination at the material interface can be made negligible. The high purity of the Ge layer means that the detection response of the detector can be made extremely homogenous throughout the detector area.

BRIEF DESCRIPTION OF DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

FIG. 9 illustrates an X-ray imaging arrangement according to another embodiment of the invention, FIG. 10 illustrates an alternative pixelizing approach and FIG. 11 illustrates an advantageous way of implementing readout electronics.

DETAILED DESCRIPTION OF THE INVENTION

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

Figure 1:
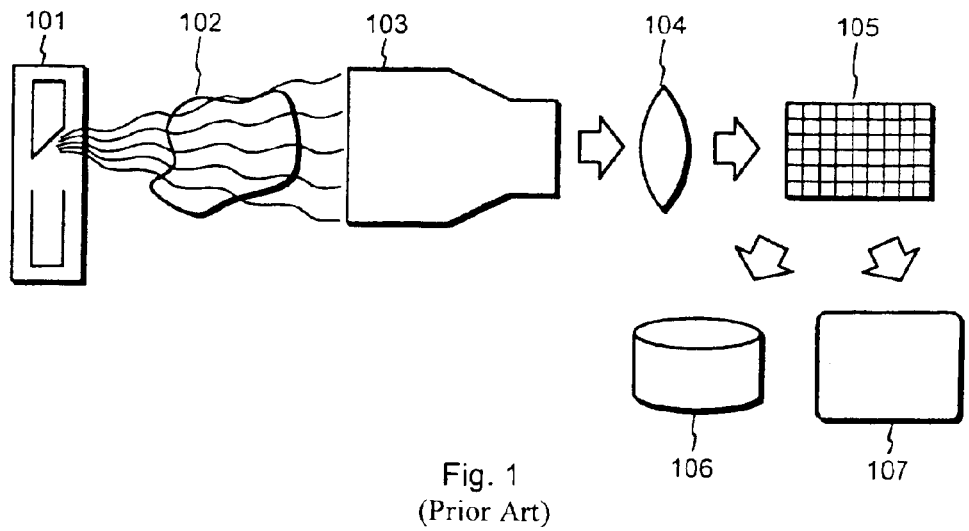
FIG. 1 illustrates a conventional X-ray imaging arrangement.
Figure 2:
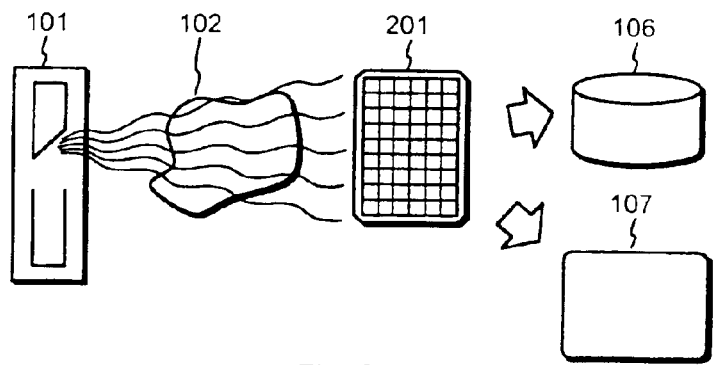
FIG. 2 illustrates a more advanced known X-ray imaging arrangement.
Figure 3:
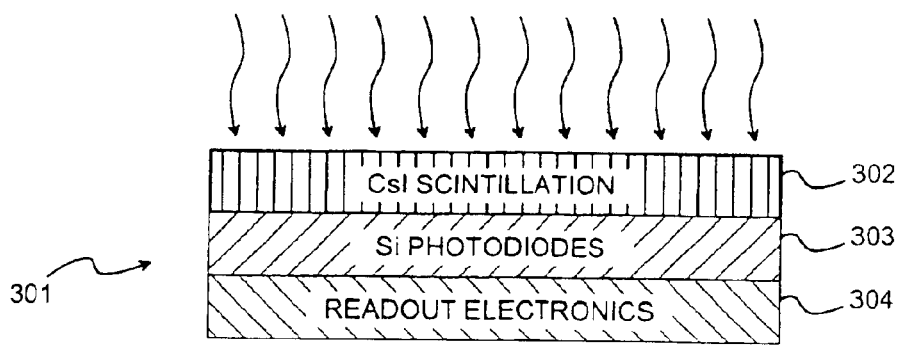
FIG. 3 is a cross section of a detector used in the arrangement of FIG. 2.
Figure 4:
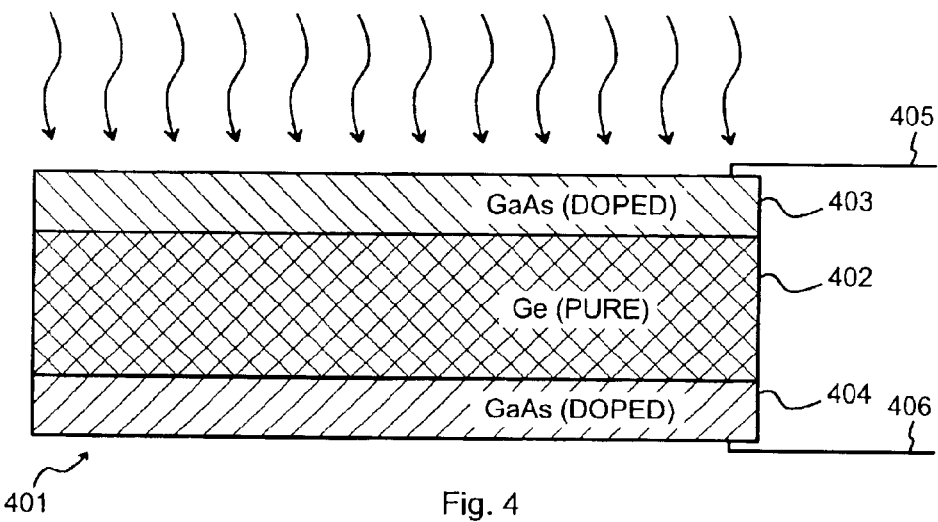
FIG. 4 is a cross section of a detector according to an embodiment of the invention.

FIG. 4 is a schematic cross section through a stack of semiconductor layers that together constitute the radiation-sensitive parts of an X-ray detector 401. Basically the detector's semiconductor stack consists of a pure Ge layer 402 sandwiched between two oppositely doped GaAs layers 403 and 404. "Oppositely doped" means that one of the GaAs layers 403 and 404 is an n-type semiconductor layer and comprises a surplus of negative charge carriers (electrons), while the other is a p-type semiconductor layer and comprises a surplus of positive charge carriers (holes). One of a pair of electrodes 405 and 406 is coupled to each of the doped GaAs layers 403 and 404. The Ge layer 402 is "pure" in the sense that its purity is as high as is commercially reasonably achievable.

Electrically the structure shown in FIG. 4 operates much like an ordinary GaAs pn-diode, so that it can for example be biased either in the forward or in the reverse direction. In order to be useful as an X-ray detector it is biased in the reverse direction by applying a suitable reverse bias voltage between the electrodes 405 and 406.

The GaAs layers 403 and 404 are thin enough so that they do not absorb significant amounts of X-rays incident on the detector, whereas the thickness of the Ge layer 402 is typically 200 micrometers or more. To be more exact, the thickness of the Ge layer should be selected depending on the energy of the X-ray photons that are to be detected. Typical photon energies are in the order of a few keVs, tens of keVs or even some hundreds of keVs: for example mammographic imaging applications frequently use energies of 17–25 keV while dental imaging applications use 50–60 keV and thorax imaging could use 100 keV or more. A sufficient thickness of the Ge layer is such that it serves to absorb a major portion (more than 90%) of the incident X-ray photons of interest. It is not recommendable to make the Ge layer any thicker than is necessary for achieving the absorption objective, because the thicker the Ge layer is the more its electrical characteristics tend to be dominated by residual impurities left in the Ge lattice. There is no practical upper limit for the thickness of the Ge layer, but the thicker it is, the larger must the pixels be if pixelization is required; more aspects of pixelization are described later. A sufficient thickness for the Ge layer is in many cases less than 2 mm, but even thicknesses of several centimeters like in certain neutron detectors can be realized.

When an X-ray photon hits the detector, it causes a photoelectric effect in a Ge atom, producing a photoelectron that in turn excites a number of outer electrons from other atoms from their valence bands into the conduction band. Each excited electron leaves behind a positive hole. The resulting cloud of free charge is concentrated within a relatively small spatial area, in the order of some micrometers. The reverse-direction bias voltage across the detector drives the free charge carriers towards the GaAs layers. By suitable detection techniques it is possible to detect both the amount of produced free charge as well as the (two-dimensional) location at which it was produced. The amount of free charge produced by a single absorbed X-ray photon is proportional to the incident energy of the photon, and the location where the free charge appeared reveals the position where the photon hit the Ge layer. If the detector is at room temperature, the statistical fluctuation of the number of thermally excited free electrons is so large that it tends to mask the exact relationship between the amount of photoelectrically induced charge and the energy of the incident photon, but even in room temperature the spatial information is preserved to a reasonably large extent. Energy resolution may be possible in a coarse scale: intrinsic concentration of carriers is in the order of $2 \cdot 10^{13}$ 1/cm, which in room temperature and an exemplary pixel volume of 100× 100×100 microns means $2 \cdot 10^{13}$ electrons and a statistical fluctuation of 4500 electrons, which is equivalent to one incident photon of 20 keV. The interfering effect of thermal excitation can be reduced by cooling the detector.

Figure 5:
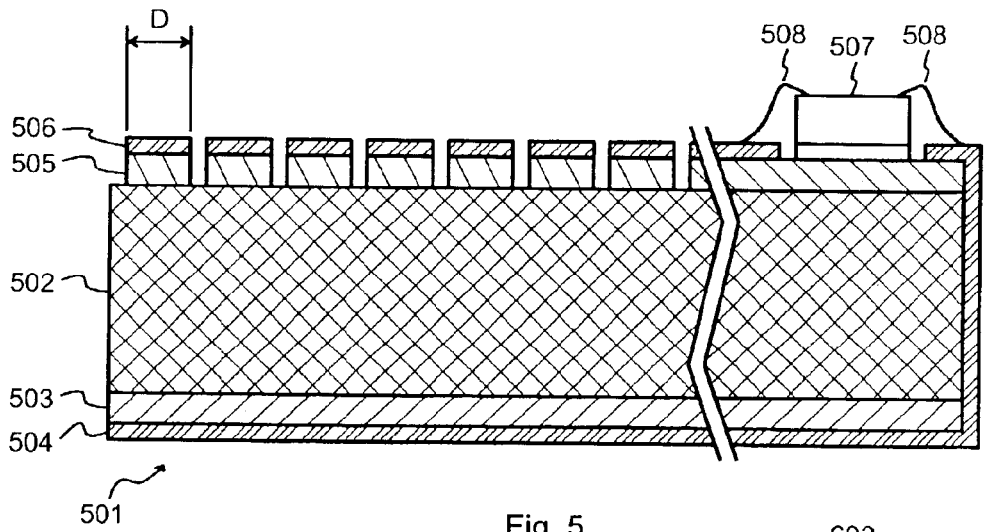
FIG. 5 illustrates bonding a readout circuit onto a detector according to an embodiment of the invention.

FIG. 5 is a cross section through a detector 501 according to an embodiment of the invention. The body of the detector is a high-purity Ge layer 502. On one planar surface of the Ge layer 502, which here is the bottom surface, there has been produced an n-type GaAs layer 503, which is further covered by an ohmic contact layer 504. The other planar surface of the Ge layer 502, which here is the top surface, carries a p-type GaAs layer that has been patterned to form a continuous array of distinct p-type GaAs pixels 505. The dimensions D of each pixel in the planar direction of the plate-like detector are typically in the order of 50–100 micrometers. An arrangement of ohmic contacts 506 has been produced on top of the pixels 505 in order to facilitate pixelwise reading of accumulated free charge in the detector 501.

Also very much larger pixels are possible. The limiting case is a non-imaging detector where a single "pixel" covers the whole detector area. Pixels in the scale of several millimeters or even centimeters can be used for example in simple "pinhole camera" applications where X-ray radiation is allowed to enter through a small aperture so that it hits a detector and produces a rough image of what kind of radiation sources are located ahead in the shooting direction.

At one location of the detector 501 there has been placed an integrated circuit 507 the task of which is to implement the readout functions. Bonding wires 508 couple the integrated circuit 507 to all necessary ohmic contacts on the surfaces of the detector 501. The integrated circuit 507 is typically an ASIC (Application Specific Integrated Circuit) that has been specifically designed for this purpose.

Figure 6:
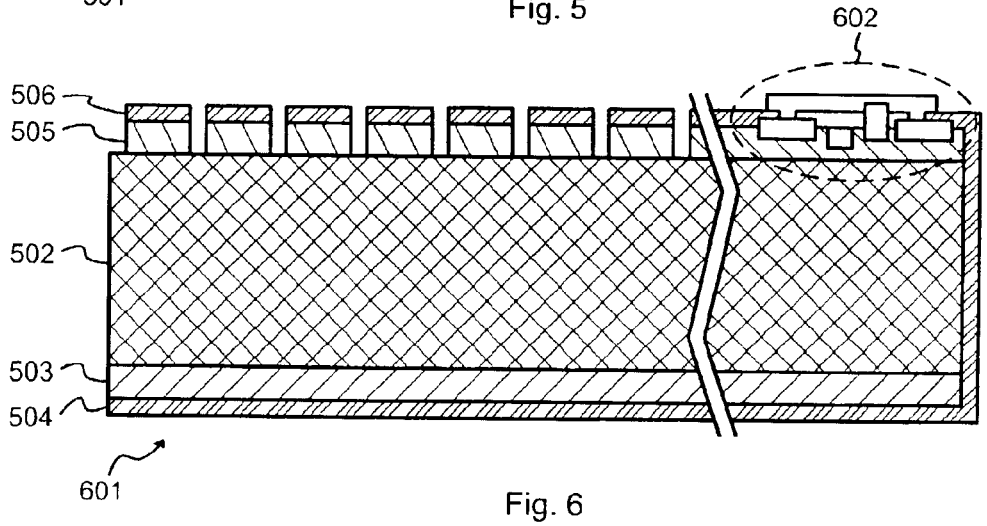
FIG. 6 illustrates integrating a readout circuit with a detector according to an embodiment of the invention.

FIG. 6 illustrates a detector 601 that is a variation of the detector 501 shown in FIG. 5. The only difference is in the implementation of the readout circuitry. Instead of bonding a separately manufactured ASIC onto the detector plate, in FIG. 6 a readout circuit 602 has been processed directly into the GaAs semiconductor substrate constituted by one of the GaAs layers in the detector plate. Using one of the GaAs layers in the detector plate as the substrate for an integrated circuit requires the GaAs material to be relatively heavily doped, which criterion is met since it is typical also to the GaAs—Ge—GaAs semiconductor heterostructure used according to the invention that the dopant concentration in the GaAs layers is high.

Following either one of the principles of FIGS. 5 and 6 (or even both simultaneously) it is possible to place two or more separate circuit units onto the detector plate, if necessary.

Figure 7A:
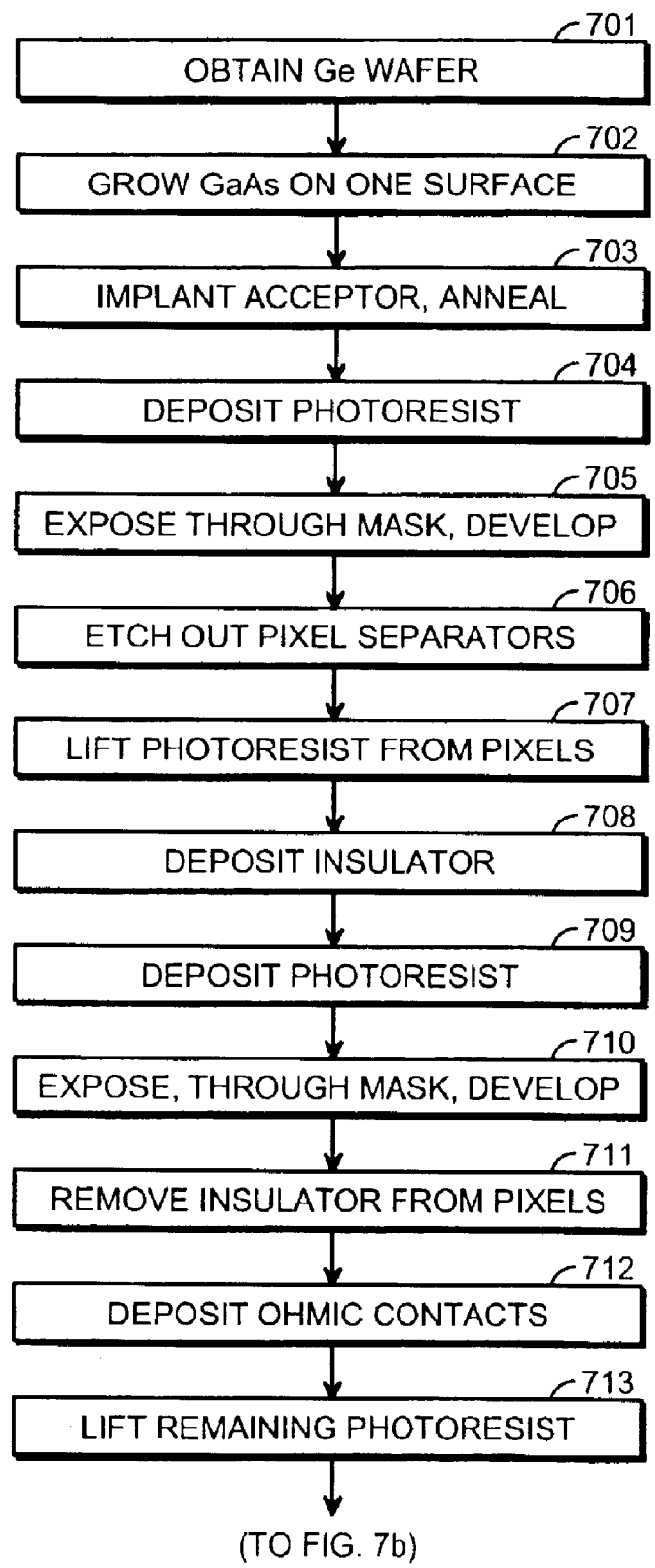
FIGS. 7a and 7b illustrate a method according to an embodiment of the invention.
Figure 7B:
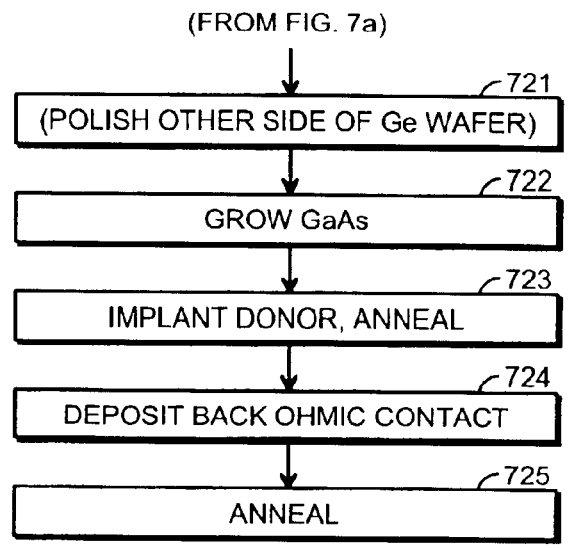

FIGS. 7a and 7b together show an exemplary step-by-step method for manufacturing a detector plate according to an embodiment of the invention. The method starts at step 701 by obtaining a high-purity Ge wafer of a desired thickness. In case the planar surfaces of the Ge wafer need polishing or other preparation before starting the process of depositing the GaAs layers, such preparative measures can be conceptually included in step 701. In the method of FIGS. 7a and 7b we assume that the pixelized GaAs layer is the p-type layer and that it is produced first, so step 702 involves epitaxial growth of GaAs on that surface of the Ge wafer that is going to be pixelized. At step 703 acceptor ions are implanted into the epitaxially grown GaAs layer to make it appear as a p-type semiconductor. Typical acceptor implanting may involve something like $3 \times 10^{13}$ Mg$^+$ ions per square centimeter implanted at an energy of 33 keV. Thermal annealing at 850° C. for the duration of 20 s follows the implanting to allow restoring crystalline defects caused by the implanting ion beam.

Ion implanting is not the only known way of producing doped semiconductor layers. It is only mentioned here as en example of how the desired result can be achieved. For the purposes of present invention the importance of step 703 (and step 723 below) is in the result achieved therethrough: when completed, the GaAs layer must be suitably doped.

At step 704 a photoresist of the thickness of about 1 micrometer is deposited on the ion-implanted GaAs layer. The photoresist must be selected so that it allows chemical etching. At step 705 the photoresist is exposed through a suitable mask and developed so that photoresist remains on pixels and all other places where GaAs will be needed, but essentially does not remain on the pixel separator lines. The pixel separators are etched out chemically over a depth of approximately 1–2 micrometers at step 706 by using for example a solution of $NH_4OH:H_2O_2:H_2O$ in ratios 1:1:50 and a 20 minutes exposure time at room temperature. At step 707 the residual photoresist that remains on the pixels and other preserved GaAs areas is removed.

Step 708 involves plasma deposition of a thin (about 40 nanometers) insulator substance like $Si_3N_4$ over the entire surface at an elevated temperature in the order of 300° C. At step 709 another photoresist layer of about 1 micrometer is deposited, the photoresist now having to sustain plasma etching. At step 710 the photoresist is exposed and developed, this time to open over the pixels and other locations where the insulator layer must be removed. Selective removing of the insulator over the exposed areas through plasma etching follows at step 711. Exemplary process parameters for the plasma etching step are 50 W, 0.04 Torr, 50 $cm^{-3}s^{-1}$. Plasma etching shoud stop when the GaAs surface is reached.

At step 712 ohmic contacts are deposited on the exposed GaAs surfaces of the pixels by thermal evaporation. A typical composition of an ohmic contact deposited through thermal evaporation is 10 nanometers of Pt, followed by 30 nanometers of Ti, another 10 nanometers of Pt and finally 300 nanometers of Au. Removing the remaining photoresist at step 713 finalizes the manufacturing of the pixelized p-type GaAs surface.

Preparing the other planar surface of the detector plate, which in this example is the unpatterned n-type GaAs side, is more straightforward. If the remaining free surface of the Ge wafer needs polishing for example to exactly determine the thickness of the Ge layer, it is accomplished at step 721. Step 722 involves epitaxial growth of GaAs on the surface. At step 723 the GaAs layer is implanted with donor ions and annealed. At step 724 an even back ohmic contact is deposited, consisting for example of 15 nanometers of Ni, followed by 19.5 nanometers of Ge, 39 nanometers of Au, 50 nanometers of Ti and finally 200 nm of Au. Final thermal annealing at 400° C. for the duration of 40 s under a $H_2$ flux, with the detector plate lying on the p-type side, finalizes the manufacturing process at step 725.

Figure 8:
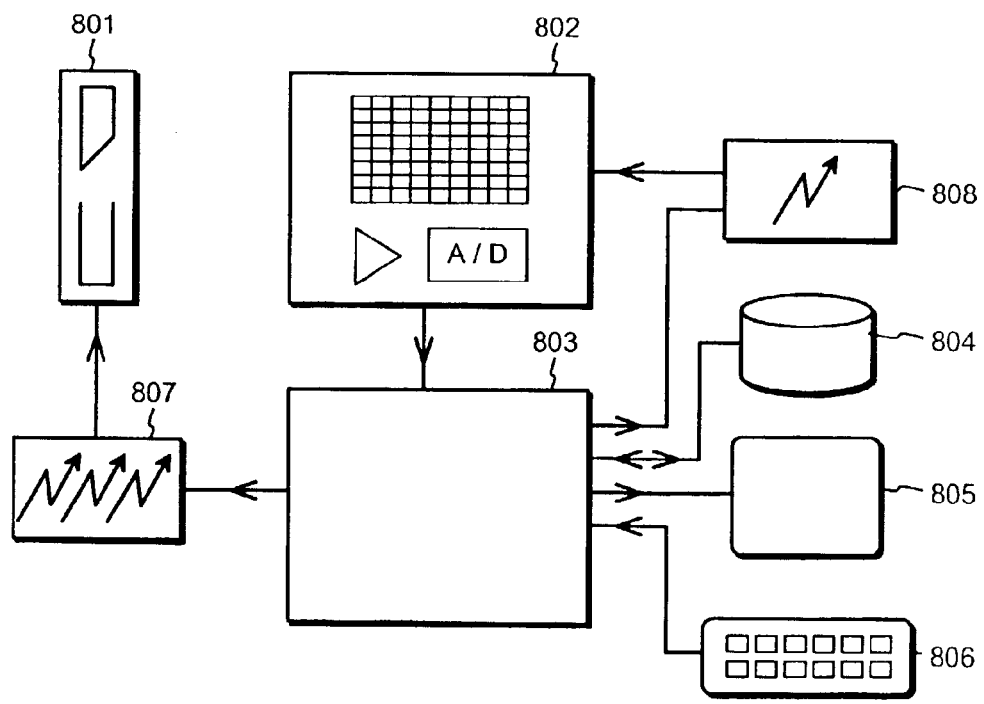
FIG. 8 illustrates an X-ray imaging arrangement according to an embodiment of the invention.

FIG. 8 illustrates an X-ray imaging arrangement according to an embodiment of the invention. An X-ray tube 801 is used as a source for X-rays in the range of some tens of keVs. A detector arrangement 802 is arranged to receive the X-rays that propagated through an object under study. The detector arrangement 802 comprises the pixelized GaAs—Ge—GaAs detector plate as well as readout, amplification and A/D converter circuitry either bonded to it or processed directly onto one of the GaAs layers. The detector arrangement 802 is coupled to a central processing unit 803 for delivering the A/D-converted measurement results thereto. It would also be possible to place the amplifying and A/D-conversion circuitry at least partly into the central processing unit 803, but placing it as near as possible to the location of the actual detection helps to eliminate noise from the measurement results.

The central processing unit 803 is coupled to a memory 804 for storing digital images received from the detector arrangement as well as for reading previously stored digital images from the memory. The central processing unit has also a user interface that comprises a display 805 for displaying digital images and a keyboard 806 for receiving key commands from a human user. In order to control the process of X-ray imaging the central processing unit 803 is coupled to a high voltage source 807 that generates the voltage(s) required in the X-ray tube 801 and to an operating voltage source 808 that provides operating voltages to the detector arrangement 802.

The purpose of use of the X-ray imaging arrangement dictates among other things the physical size of the pixelized area in the detector arrangement 802. Generally the size of the pixelized area is directly proportional to the size of the object to be studied. Monolithic detectors are in many cases the most advantageous in terms of image quality, because with a monolithic detector it is easy to obtain a highly homogenous response over the whole imaging area. Using a 6-inch or even an 8-inch Ge wafer as a starting point for building a detector would make is possible to use a monolithic direct conversion detector in a mammographic X-ray imaging application. If even larger imaging areas are required, it is possible to use an even larger monolithic wafer (disc diameters of 300 or even 450 mm have been suggested) or to tile several monolithic detector arrangements side by side. Careful calibrating is needed to ensure homogeneity of imaging response if several different detector arrangements are used. Having readout, amplification and A/D-conversion circuitry integrated on the same substrate with the actual detector (either by bonding or by directly processing) allows automatic compensation: it is possible to measure the response over a detector and to program the integrated electronics so that they automatically compensate for any possibly detected unhomogeneity in imaging response.

In an ultimately simplified case the detector arrangement 802 would not need to comprise pixels at all, if at least one of the following conditions is met:

only the intensity of radiation that passed through the object under study is of importance, not its spatial distribution, the size of the detector arrangement 802 is small compared to the size of the details in the object under study, so that one image obtained at a correct location is enough to reveal the information of interest, the imaging arrangement comprises means for moving at least one of the X-ray tube 801 and the detector arrangement 802 in respect of the object under study, so that a more extensive image can be obtained by scanning.

FIG. 9 illustrates another imaging arrangement that is additionally meant to be used for X-ray spectroscopy, which means that the arrangement should be able to detect not only the locations of received X-ray photons on the detector plate but also their energies. The detector arrangement 901 could be similar to that used in the imaging arrangement of FIG. 8, but most probably it is advantageous to use different readout, amplification and A/D-conversion circuitry that is optimized for spectroscopy. In order to reduce the interfering effect of thermally excited electrons in the Ge layer the detector arrangement 901 is within the influence of a cooling arrangement 902, which may include e.g. thermoelectric (Peltier) cooling and/or cooling through the use of liquified gas. The central processing unit 903 is arranged to receive both spatial and spectroscopic information from the detector arrangement 901 and to store it into a memory 904. We assume that the imaging arrangement of FIG. 9 is built for remote-controlled operation, which means that a telemetric transceiver 905 replaces any local user interfaces. An operating voltage source 906 operates under the control of the central processing unit 903 to provide operating voltages to the detector arrangement 901. A temperature sensor 907 is provided within the cooling arrangement 902 for providing the central processing unit with information about the temperature of the detector arrangement 901.

FIG. 10 illustrates an alternative approach to the task of providing an X-ray detector according to the invention with spatial resolution capability. The high-purity Ge layer 1001 is only shown schematically with dotted lines. One planar surface of the Ge layer 1001 comprises mutually parallel p-doped GaAs strips, of which strips 1011 and 1012 as well as a number of strips between them are shown. These strips have a certain longitudinal direction. The other planar planar surface of the Ge layer 1001 comprises mutually parallel n-doped GaAs strips, of which strips 1021 and 1022 as well as a number of strips between them are shown. These strips have also a certain longitudinal direction, which however is different than that of the strips 1011 to 1012 on the first surface. The thickness of all layers is heavily exaggerated in FIG. 10 in order to enhance graphical clarity.

FIG. 11 shows how the detector structure of FIG. 10 can be used in an X-ray imaging arrangement. The GaAs strips in the "double-striped" detector arrangement 1101 are connected to readout electronics so that the strips on one side of the Ge layer are connected to one bias and readout circuit 1102 and the strips on the other side of the Ge layer are connected to another bias and readout circuit 1103 (naturally all strips could as well be connected to a common bias and readout circuit, or to common bias circuit and to common readout circuit, as long as knowledge about which signal came from which strip is maintained). Each of the bias and readout circuits 1102 and 1103 detects the hit of an X-ray photon as a transient potential swing in one of the GaAs strips connected thereto. The corresponding readout signal is taken to signal processing electronics where a correlation between signals from both sides of the detector arrangement is detected. The fact that the orientation of the GaAs strips is different on different sides of the detector means that a simultaneous signal from a certain pair of strips can only be the result of an X-ray photon hitting the detector at the intersection of those strips.

An arrangement of differently oriented straight GaAs lines on different sides of the Ge layer is not the only possible geometry that can be used in the double-sided pixelizing approach. From the general field of imaging detectors also other geometries are known. It is straightforward as such to apply some known pixelizing geometry to the basic idea of having oppositely doped GaAs layers on the opposite sides of a Ge layer.

Previously the advantages of bonding a readout chip onto a detector plate or even integrating the readout circuitry directly onto the semiconductor material of a detector plate were discussed. On the other hand we must remember that not placing bias and readout circuits into direct contact with the detector means that the heat dissipated in the electronic circuits does not warm up the detector. For example in the arrangement of FIG. 11 it may well be most advantageous to thermally isolate the bias and readout circuits 1102 and 1103 from the detector arrangement 1101. All embodiments of the invention can be easily implemented so that the readout electronics are thermally isolated from the detector materials.

What is claimed is:

1. An X-ray detector comprising, as a detecting element, a semiconductor heterostructure where an undoped Germanium layer is enclosed between two oppositely doped Gallium Arsenide layers.

2. An X-ray detector according to claim 1, wherein the thickness of the Germanium layer is between 200 micrometers and 2 millimeters, and the thickness of each of the Gallium Arsenide layers is between 1 and 5 micrometers.

3. An X-ray detector according to claim 1, comprising a multitude of pixels for detecting a spatial distribution of X-rays incident on the X-ray detector.

4. An X-ray detector according to claim 3, wherein:
the pixels comprise discrete pieces of the Gallium Arsenide layer on one side of the Germanium layer, with physical separation between adjacent pixels, and
the Gallium Arsenide layer on that side of the Germanium layer that does not comprise pixels is even.

5. An X-ray detector according to claim 3, wherein each of the Gallium Arsenide layers comprises a number of stripes, the stripes of one Gallium Arsenide layer having a general orientation that is different than a general orientation of the stripes of the other Gallium Arsenide layer, so that intersection regions between stripes of different Gallium Arsenide layers constitute the pixels.

6. An X-ray detector according to claim 1, being arranged to be used in room temperature.

7. An X-ray imaging arrangement, comprising:
a solid-state semiconductor detector for detecting X-rays and for converting a detected intensity of X-rays into a digital value, and
within the solid-state semiconductor detector a semiconductor heterostructure where an undoped Germanium layer is enclosed between two oppositely doped Gallium Arsenide layers.

8. An X-ray imaging arrangement according to claim 7, wherein:
the X-ray imaging arrangement comprises a controllable X-ray source for controllably illuminating an object under study with X-rays, and
the solid-state semiconductor detector is arranged to detect X-rays that have passed through the object under study.

9. An X-ray imaging arrangement according to claim 7, wherein the solid-state semiconductor detector is arranged to detect X-rays that come from distant, originally unspecified sources.

10. An X-ray imaging arrangement according to claim 7, wherein:
the solid-state semiconductor detector comprises a multitude of pixels for detecting a spatial distribution of X-rays incident on the solid-state semiconductor detector
the solid-state semiconductor detector is arranged to convert a detected intensity of X-rays pixel-wise into a multitude of digital values and
the X-ray imaging arrangement is arranged to store such a multitude of digital values in the form of a digital image.

11. An X-ray imaging arrangement according to claim 7, additionally comprising a cooling arrangement for cooling the solid-state semiconductor detector in order to reduce interference caused by thermally excited electrons in the Germanium layer.

12. An X-ray imaging arrangement according to claim 11, wherein the solid-state semiconductor detector is arranged to convert also a detected energy of an incident X-ray photon into a digital value, and the X-ray imaging arrangement is arranged to produce a spectroscopic representation of a number of detected X-ray photons.

13. An X-ray imaging arrangement according to claim 7, comprising a signal processing circuit bonded onto one of said Gallium Arsenide layers.

14. An X-ray imaging arrangement according to claim 7, comprising a signal processing circuit processed directly onto one of said Gallium Arsenide layers.

15. A method for producing an X-ray detector, comprising the steps of:

producing a first doped Gallium Arsenide layer on a first side of an undoped Germanium plate, and producing a second doped Gallium Arsenide layer on a second side of the undoped Germanium plate, which second doped Gallium Arsenide layer is differently doped than the first doped Gallium Arsenide layer.

16. A method according to claim 15, comprising the steps of:

epitaxially growing a first Gallium Arsenide layer on a first side of an undoped Germanium plate, implanting said first Gallium Arsenide layer with a dopant of a first type, said first type being either donor or acceptor, epitaxially growing a second Gallium Arsenide layer on a second side of said undoped Germanium plate, and implanting said second Gallium Arsenide layer with a dopant of a second type, which is opposite to the type of the dopant implanted into said first Gallium Arsenide layer.

17. A method according to claim 16, comprising the steps of:

depositing a photoresist layer on one of the Gallium Arsenide layers, exposing said photoresist through a mask that constitutes an array of pixels, and developing the exposed photoresist so that photoresist remains on an array of pixels on said one of the Gallium Arsenide layers, and etching away Gallium Arsenide from between said pixels so that physical separations appear between adjacent pixels.

18. A method according to claim 15, comprising the step of bonding a signal processing circuit onto one of said Gallium Arsenide layers.

19. A method according to claim 15, comprising the step of processing a signal processing circuit directly onto one of said Gallium Arsenide layers.

* * * * *